United States Patent
Hsu et al.

(10) Patent No.: US 6,768,678 B1
(45) Date of Patent: Jul. 27, 2004

(54) DATA SENSING METHOD USED IN A MEMORY CELL CIRCUIT

(75) Inventors: Yu-Ming Hsu, Hsin-Chu (TW); Jie-Hau Huang, Tai-Chung Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/249,076

(22) Filed: Mar. 14, 2003

(51) Int. Cl.[7] ............................................. G11C 16/06
(52) U.S. Cl. .............................. 365/185.21; 365/185.33
(58) Field of Search ......................... 365/185.21, 185.33

(56) References Cited

U.S. PATENT DOCUMENTS

| | | | | |
|---|---|---|---|---|
| 5,859,798 A | * | 1/1999 | Yero ...................... | 365/185.21 |
| 5,917,753 A | * | 6/1999 | Dallabora et al. ..... | 365/185.21 |
| 6,191,979 B1 | * | 2/2001 | Uekubo .................. | 365/185.21 |
| 6,259,645 B1 | * | 7/2001 | Chen et al. ............ | 365/185.21 |
| 6,625,062 B2 | * | 9/2003 | Won et al. ............. | 365/185.33 |
| 6,687,162 B1 | * | 2/2004 | Hsueh et al. .......... | 365/185.21 |

* cited by examiner

Primary Examiner—Trong Phan
(74) Attorney, Agent, or Firm—Winston Hsu

(57) ABSTRACT

A device and method for data sensing includes turning off a first and a second program switches while turning on a first and a second switches in order to output a first current corresponding to a first data from a first memory cell to a biasing circuit, also to output a second current corresponding to a second data from the biasing circuit to a second memory cell, and to charge or discharge a loading node using a difference of the first and the second currents to sense a loading voltage.

52 Claims, 9 Drawing Sheets

DATA SENSING METHOD USED IN A MEMORY CELL CIRCUIT

BACKGROUND OF INVENTION

1. Field of the Invention

The present invention provides a data sensing method used in a memory cell circuit, and more specifically, a method to charge or discharge a loading node using a difference of a first and a second currents to sense a loading voltage.

2. Description of the Prior Art

A memory is a vital component In electronic products. Memory comprises a memory cell array comprising memory cells wherein each memory cell is applied to store a bit of digital data and to perform programming, erasing, and reading of the memory cell according to a variety of control signals transmitted from a word line, a bit line, and et al. A sense amplifier is usually provided in the memory for sensing digital data stored in the memory cell and generating an output signal corresponding to the digital data when the memory is reading the memory cell.

Please refer to FIG. 1. Illustrated in FIG. 1 is a schematic diagram of a prior art sense amplifier 10. As shown FIG. 1, the sense amplifier 10 comprises two NMOS transistors 12 and 14 and two PMOS transistors 15 and 18 for providing the necessary amplification to the sense amplifier 10 and an NMOS transistor 20 whose gate is electrically connected to a biasing voltage $V_B$ for providing a biasing voltage current to the sense amplifier 10. As mentioned above, the sense amplifier 10 is a differential amplifier amplifying a difference of signals transmitted from two receiving points $Vin^+$ and $Vin^-$ of the gates of the NMOS transistors 12 and 14. The amplified result can be represented by an output signal Vout from an output terminal of the drain of the NMOS transistor 14.

Usually when the sense amplifier 10 is applied in the memory, the data input point $Vin^-$ is electrically connected to a memory cell and the reference input point $Vin^-$ is electrically connected to a reference voltage. The principles of operation of the sense amplifier 10 are as follows. If the memory wants to perform reading on the memory cell, it will control the memory cell with a variety of control signals so that the memory cell will generate a current corresponding to the stored data. Through a specific circuit design, the current will be converted into a voltage being transmitted to the data input point $Vin^+$ of the sense amplifier 10. The sense amplifier 10 will apply differential amplification on the voltage received from the data input point $Vin^+$ and the reference input point $Vin^-$ for generating an output signal from the outputting terminal Vout corresponding to the data stored in the memory cell.

However, when performing reading, three far more complicated processes, pre-charging, data sensing, and data latching are also applied in the sense amplifier 10. Before the sense amplifier 10 amplifies data stored in the memory cell, the pre-charging process will be applied to charge voltages of the input points $Vin^+$ and $Vin^-$ to the same potential such that the potential value of the data input point $Vin^+$ is the same as the reference voltage to avoid any difference of the voltages at the input points $Vin^+$ and $Vin^-$ generated by a reading process previously performed. The data sensing process represents the above-mentioned process that the sense amplifier 10 is applied to sense data stored in the memory cell and generate a corresponding output signal. After the sense amplifier 10 generates the output signal, a data latching process is applied to keep the output signal in a latch from being lost so that a following circuit can use the output signal.

The pre-charging, data sensing, and data latching processes require a precise sequential control to maintain correctness of the output signal. Thus, a control circuit is usually provided in the memory for generating control signals in proper sequential order. The control circuit is mainly comprised of logic gates and delay circuits. Because a delay circuit requires a large number of capacitors, the control circuit is an integrated circuit occupying a lot of area. To a high density memory having amounts of memory cells wherein the memory cell arrays in the high density memory occupy a huge amount of area, it is reasonable that the control circuit occupies much area. However, for a low density memory having only limited numbers of memory cells, the control circuit occupies just as much area. It is not reasonable for a control circuit for a low density memory to occupy as much area as a control circuit for a high density memory.

SUMMARY OF INVENTION

It is therefore a primary objective of the claimed invention to provide a data sensing method used in a memory cell circuit without the need to perform a precise sequential control to overcome the problems of the prior art.

According to the claimed invention, a data sensing method is used in a memory cell circuit. The memory cell circuit includes a first memory cell for storing a non-volatile first data, a second memory cell for storing a non-volatile second data, a first program switchelectrically connected to the first memory cell for controlling the reception of the first data, a second program switchelectrically connected to the second memory cell for controlling the transmission of the second data, and a biasing circuit. The biasing circuit has a first switch, a second switch, and a loading node wherein the first switch is electrically connected between the first memory cell and the loading node and the second switch is electrically connected between the second memory cell and the loading node.

The method comprises turning on the first and the second program switches and turning off the first and the second switches to make the memory cells stay in a program mode in order to write the first data to the first memory cell and to write the second data to the second memory cell, turning off the first and the second program switches and turning on the first and the second switches to make the memory cell circuit stay in a read mode in order to transmit a first current corresponding to the first data from the first memory cell to the biasing circuit and to transmit a second current corresponding to the second data from the biasing circuit to the second memory cell, and charging or discharging the loading node using a difference of the first and the second currents to sense a loading voltage.

The claimed invention applies currents generated by the memory cell to charge or discharge the loading node to sense the loading voltage and read data stored in the memory cell. Complicated processes such as pre-charging, data sensing, and data latching are not applied in the present invention. Thus, a control circuit occupying a huge area is no longer required.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
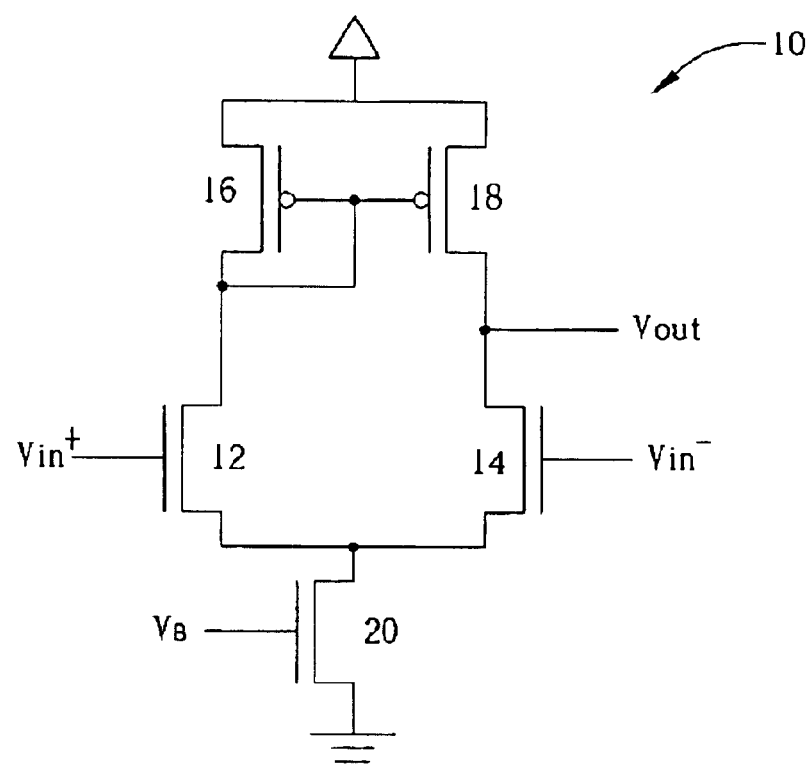
FIG. 1 is a schematic diagram of a prior art sense amplifier.
Figure 2:
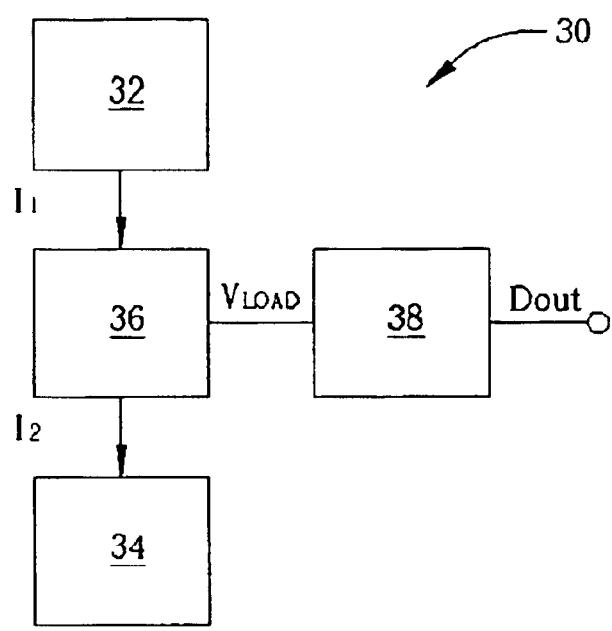
FIG. 2 is a block diagram of a memory cell circuit according to the present invention.

Please refer to FIG. 2. Illustrated in FIG. 2 is a block diagram of the first embodiment according to the present invention memory cell circuit 30. The present invention memory cell circuit 30 comprises a first memory cell 32 for storing a non-volatile first data $D_1$ to generate a first current $I_1$ corresponding to the first data $D_1$ when the memory cell circuit 30 is in a read mode, a second memory cell 34 for storing a non-volatile second data $D_2$ to receive a second current $I_2$ corresponding to the second data $D_2$ when the memory cell circuit 30 is in the read mode, a biasing circuit 36 electrically connected to the first memory cell 32 and the second memory cell 34 for receiving the first current $I_1$ from the first memory cell 32 and transmitting the second current $I_2$ to the second memory cell 34 when the memory cell circuit 30 is in the read mode, and an amplifying circuit 38 electrically connected to an unillustrated loading node $N_{LOAD}$ of the biasing circuit 36 for sensing a loading voltage $V_{LOAD}$ when charging or discharging an equivalent capacitor of the loading node $N_{LOAD}$ using a difference of the first current $I_1$ and the second current $I_2$, and transmitting and amplifying the loading voltage $V_{LOAD}$ to generate an output signal Dout corresponding to the first data $D_1$.

The memory cell circuit 30 further comprises an unillustrated control circuit electrically connected to the first memory cell 32, the second memory cell 34, and the biasing circuit 36 for providing a variety of different logic values onto the plurality of control signals when the memory cell circuit 30 is in a program mode or in the read mode. Please notice that the first data $D_1$ and the second data $D_2$ are respectively written into the first memory cell 32 and the second memory cell 34 when the cell circuit 30 is in the program mode and that the first data $D_1$ is the complement of the second data $D_2$. In other words, if the memory cell 32 is In a PGM (program) state, the memory cell 34 will be in an erase state, and if the memory cell 32 is in an erase state, the memory cell 34 will be in a PGM state.

Figure 3:
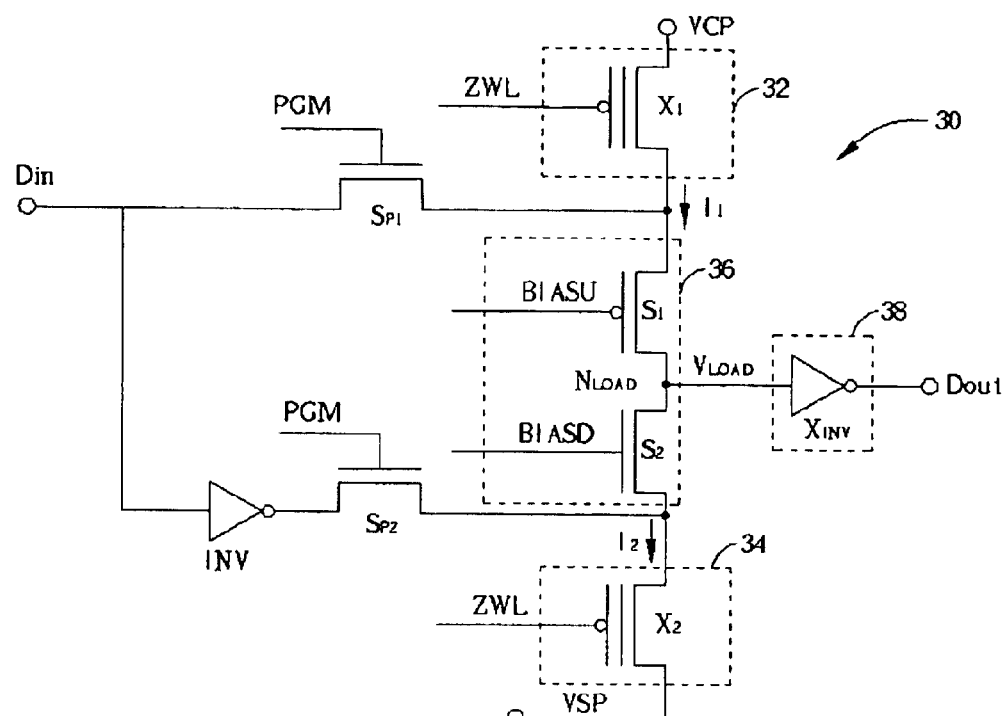
FIG. 3 is a circuit diagram of the memory cell circuit of FIG. 2.

Please refer to FIG. 2 and FIG. 3. Illustrated in FIG. 3 is a circuit diagram of the memory cell circuit 30 shown in FIG. 2. In FIG. 3, the first memory cell 32 and the second memory cell 34 are labeled as memory cell $X_1$ and $X_2$ respectively and are flash memory cells having a stacked gate structure. Each flash memory cell $X_1$ and $X_2$ comprises a control gate, a floating gate, and two end points. The biasing circuit 36 comprises a first switch $S_1$ and a second switch $S_2$. The first switch $S_1$ is electrically connected between the memory cell $X_1$ and the loading node $N_{LOAD}$ for controlling the reception of the first current $I_1$, and the second switch $S_2$ is electrically connected between the memory cell $X_2$ and the loading node $N_{LOAD}$ for controlling the transmission of the second current $I_2$. The amplifying circuit 38 is an inverter $X_{INV}$ electrically connected to the loading node $N_{LOAD}$ for transmitting and amplifying the loading voltage $V_{LOAD}$ to generate the output signal Dout.

The memory cell circuit 30 in FIG. 3 further comprises a data-receiving point Din for receiving the first data $D_1$ meant to be stored in the memory cell $X_1$ into the memory cell circuit 30 when the memory cell circuit 30 is in the program mode. The memory cell circuit 30 illustrated in FIG. 3 further comprises an inverter INV, a first program switch $S_{P1}$ and a second program switch $S_{P2}$. The data-receiving point Din is electrically connected to a receiving point of the inverter INV (thus, the second data D2 will be outputted from the output terminal of the inverter INV). The first program switch $S_{P1}$ is electrically connected between the data-receiving point Din and the memory cell $X_1$ for controlling the reception of the first data $D_1$. The second program switch $S_{P2}$ is electrically connected between the output terminal of the inverter INV and the memory cell $X_2$ for controlling the reception of the second data $D_2$.

The memory cell circuit 30 illustrated in FIG. 3 further comprises an unillustrated control circuit for providing a mode selecting signal PGM electrically connected between the first program switch $S_{P1}$ and the second program switch $S_{P2}$ to control turning on the first program switch $S_{P1}$ and the second program switch $S_{P2}$ a word line signal ZWL electrically connected to control gates of the memory cell $X_1$ and $X_2$, a first biasing voltage signal BIASU electrically connected to the first switch $S_1$ for controlling turning on the first switch $S_1$, and a second biasing voltage signal BIASD electrically connected to the second switch $S_2$ for controlling turning on the second switch $S_2$.

The memory cell circuit 30 in FIG. 3 further comprises an unillustrated power supplier and an unillustrated biasing voltage circuit wherein the power supplier is capable of generating a first voltage level Vpp, a second voltage level Vdd, and a ground voltage level Vss. The first voltage level Vpp is a pumped voltage needed when a non-volatile memory is performing programming. In FIG. 3 during programming, voltage sources VCP and VSP are level with Vpp. The second voltage level Vdd and the ground voltage level Vss are power supplier voltages needed during data-accessing, and a potential of the first voltage level Vpp is higher then the second voltage level Vdd.

In FIG. 3 during data-accessing, the biasing voltage circuit is capable of generating a first biasing voltage level Vbu and a second biasing voltage level Vbd wherein the first biasing voltage level Vbu is applied for turning on the first switch $S_1$ to make the first switch $S_1$ stay in an ideal biasing voltage level for avoiding a reading disturbance from the memory cell $X_1$, and the second biasing voltage level is applied for turning on the second switch $S_2$ to make the second switch stay in an ideal biasing voltage level for avoiding a reading disturbance from the memory cell $X_2$. A so-called reading disturbance is a situation that a soft programming occurs because the potential difference Vds is too large when a non-volatile memory cell is in a read mode.

In the memory cell circuit 30 illustrated in FIG. 3, the first program switch $S_{P1}$ and the second program switch $S_{P2}$ are NMOS transistors, the memory cell $X_1$ and the memory cell $X_2$ are p-type channel flash memory cells, the first switch $S_1$ is a PMOS transistor, and the second switch $S_2$ is an NMOS transistor.

Figure 4:
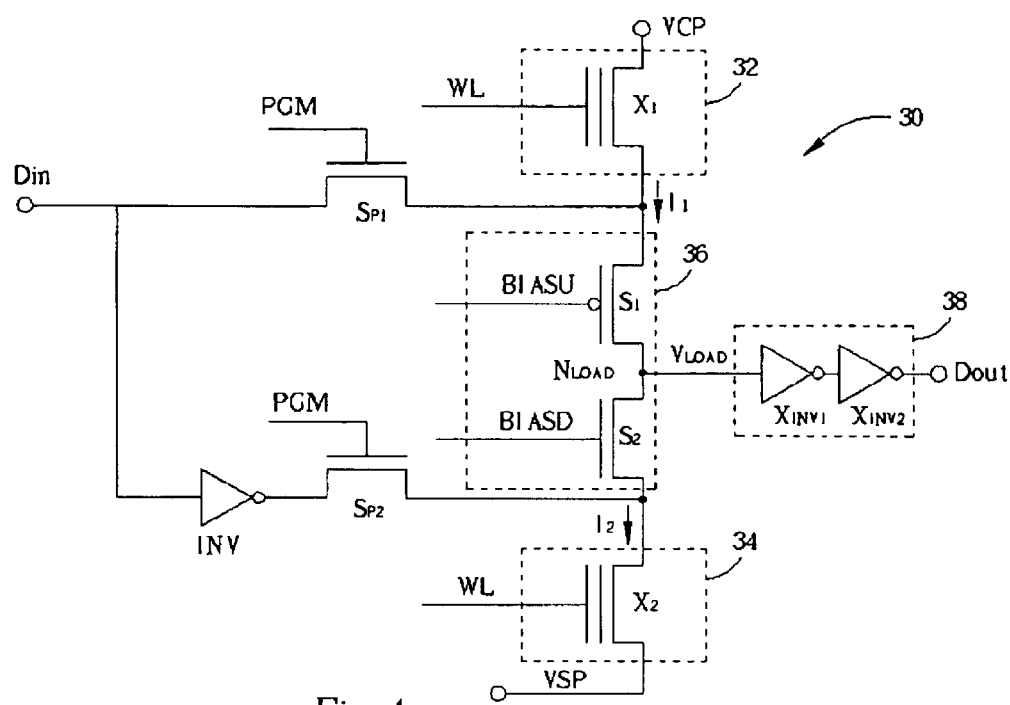
FIG. 4 is another circuit diagram of the memory cell circuit of FIG. 2.
Figure 5:
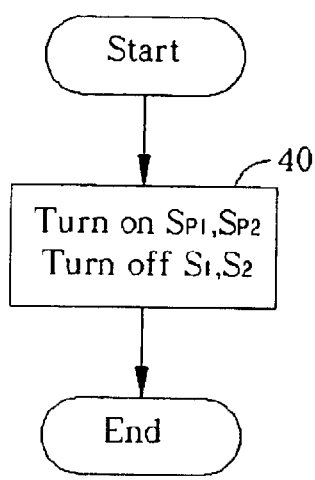
FIG. 5a is a flowchart diagram of a program process of the memory cell circuit illustrated in FIG. 3 and FIG. 4.
FIG. 5b is a flowchart diagram of a reading process of the memory cell circuit illustrated in FIG. 3 and FIG. 4.
Figure 5:
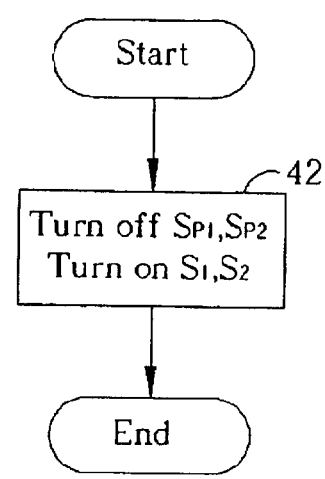

Please refer to FIG. 2 and FIG. 4. Illustrated in FIG. 4 is another circuit diagram of the memory cell circuit 30 illustrated in FIG. 2. Because much of the circuit organization illustrated in FIG. 4 is very similar to the one illustrated in FIG. 3, there is no need to repeat it again. But in FIG. 4, the unillustrated control circuit of the memory cell circuit 30 provides a word line signal WL electrically connected to the control gates of the memory cells $X_1$ and $X_2$, and the amplifying circuit comprises two serially connected inverters $X_{INV1}$ and $X_{INV2}$. Additionally, the first program switch $S_{P1}$ and the second program switch $S_{P2}$ are NMOS transistors, the memory cells $X_1$ and $X_2$ are n-type channel flash memory cells, the first switch S1 is a PMOS transistor, and the second switch $S_2$ is an NMOS transistor. Please refer to FIG. 5a and FIG. 5b. Illustrated FIG. 5a and FIG. 5b are flowchart diagrams of program and reading processes of the memory cell circuit 30 illustrated in FIG. 3 and FIG. 4. The program process is illustrated in FIG. 5a. In step 40, the first program switch $S_{P1}$ and the second program switch $S_{P2}$ are turned on and the first switch $S_1$ and the second switch $S_2$ are turned off to make the memory cells stay in a program mode in order to write the first data $D_1$ to the memory cell $X_1$ and write the second data $D_2$ to the memory cell $X_2$. The reading process is illustrated in FIG. 5b. In step 42, the first program switch $S_{P1}$ and the second program switch $S_{P2}$ are turned off and the first switch $S_1$ and the second switch $S_2$ are turned on to make the memory cell circuit 30 stay in a read mode in order to transmit a first current $I_1$ corresponding to the first data $D_1$ from the memory cell $X_1$ to the biasing circuit 36, to transmit a second current $I_2$ corresponding to the second data $D_2$ from the biasing circuit 36 to the memory cell $X_2$, and to charge or discharge the loading node $N_{LOAD}$ using a difference of the first current $I_1$ and the second current $I_2$ to sense the loading voltage $V_{LOAD}$.

Please refer to FIG. 3, FIG. 5a and FIG. 5b. The memory cell circuit 30 illustrated in FIG. 3 is applied in the program and reading processes illustrated in FIG. 5a and FIG. 5b respectively. The programming method is shown in FIG. 5a. In step 40, the first biasing voltage signal BIASU gives the first voltage level VPP to the first switch $S_1$ for turning voltage level Vss to the second switch $S_2$ for turning off the second switch $S_3$, the word line signal ZWL gives the ground voltage level Vss for activating the memory cell $X_1$ and the memory cell $X_2$, the mode selecting signal PGM gives the first voltage level Vpp to the first program switch $S_{P1}$ and the second program switch $S_{P2}$ for turning on the first program switch $S_{P1}$ and second program switch $S_{P2}$ for receiving the first data $D_1$ and the second data $D_2$ to one end of the memory cell $X_1$ and the memory cell $X_2$ respectively, and the first voltage level Vpp is being transmitted to another end of the memory cell $X_1$ and the memory cell $X_2$ for performing data storageonthe floating gates of the memory cell $X_1$ and the memory cell $X_2$ respectively.

The reading process is shown in FIG. 5b. In step 42, the first biasing voltage signal BIASU gives the first biasing voltage level Vbu to the first switch $S_1$ for turning on the first switch $S_1$, the second biasing voltage signal BIASD gives the second biasing voltage level Vbd to the second switch $S_2$ for turning on the second switch $S_2$, the word line signal ZWL gives the ground voltage level Vss for activating the memory cell $X_1$ and the memory cell $X_2$, the mode selecting signal PGM gives the ground voltage level VSS to the first program switch $S_{P1}$ and the second program switch $S_{P2}$ for turning off the first program switch $S_{P1}$ and the second program switch $S_{P2}$, and the second voltage level Vdd and the ground voltage level Vssare being transmitted to one end of the memory cell $X_1$ and the memory cell $X_2$ respectively for generating the first current $I_1$ and the second current $I_2$ on another end of the memory cell $X_1$ and the memory cell $X_2$ respectively.

Please refer to FIG. 4, FIG. 5a and FIG. 5b. The memory cell circuit 30 illustrated in FIG. 4 is applied in the program and reading processes illustrated in FIG. 5a and FIG. 5b respectively. The program process is shown in FIG. 5a. In step 40, the first biasing voltage signal BIASU gives the first voltage level Vpp to the first switch $S_1$ for turning off the first switch $S_1$, the second biasing voltage signal BIASD gives the ground voltage level Vss to the second switch $S_2$ for turning off the second switch $S_2$, the word line signal WL gives the first voltage level Vpp for activating the memory cell $X_1$ and memory cell $X_2$, the mode selecting signal PGM gives the first voltage signal Vpp for turning on the first program switch $S_{P1}$ and the second program switch $S_{P2}$ for receiving the first data $D_1$ and the second data $D_2$ to one end of the memory cell $X_1$ and the memory cell $X_2$ respectively, and the first voltage level Vpp is being transmitted to another end of the memory cell $X_1$ and memory cell $X_2$ (labeled as VCP and VSP in FIG. 4)for performing data storageonthe floating gates of the memory cell $X_1$ and memory cell $X_2$ respectively.

The reading process is shown in FIG. 5b. In step 42, the first biasing voltage signal BIASU gives the first biasing voltage level Vbu to the first switch $S_1$ for turning on the first switch $S_1$, the second biasing voltage signal BIASD gives the second biasing voltage level Vbd to the second switch $S_2$ for turning on the second switch $S_2$, the word line signal WL gives the second voltage level Vdd for activating the memory cell $X_1$ and the memory cell $X_2$, the mode selecting signal PGM gives the ground voltage level Vss to the first program switch $S_{P1}$ and the second program switch $S_{P2}$ for turning off the first program switch $S_{P1}$ and the second program switch $5_{P2}$, and the second voltage level Vdd and the ground voltage level Vssare being transmitted to one end of the memory cell $X_1$ and the memory cell $X_2$ (labeled as VCP in FIG. 4) respectively for generating the first current $I_1$ and the second current $I_2$ on another end of the memory cell $X_1$ and the memory cell $X_2$ (labeled as VSP in FIG. 4) respectively.

Figure 6:
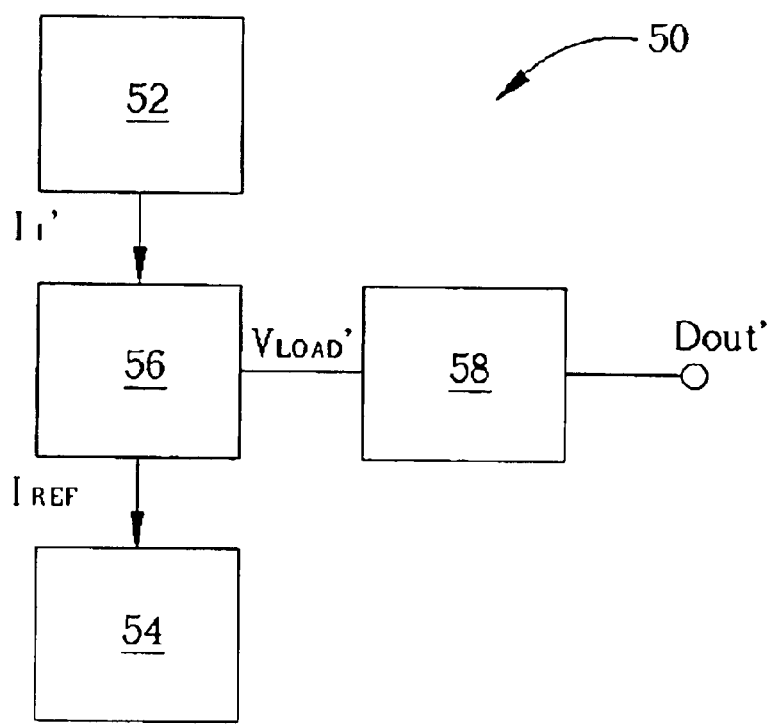
FIG. 6 is a block diagram of another memory cell circuit according to the present invention.

Please refer to FIG. 6. Illustrated in FIG. 6 is a block diagram of the second embodiment according to the present invention data sensing method. The present invention memory cell circuit 50 comprises a first memory cell 52 for storing a non-volatile first data $D_1$, to generate a first current $I_1'$ corresponding to the first data $D_1'0$ when the memory cell circuit 50 is in a read mode, a reference current unit 54 for generating a reference current $I_{REF}$ when the memory cell circuit 50 is in the read mode, a biasing circuit 56 electrically connected between the first memory cell 52 and the reference current unit 54 for receiving the first current $I_1'$ from the first memory cell 52 and transmitting the reference current $I_{REF}$ to the reference current unit 54 when the memory cell circuit 50 is in the read mode, and an amplifying circuit 58 electrically connected to an unillustrated loading node $N_{LOAD}'$ of the biasing circuit 56 for sensing a loading voltage $V_{LOAD}$, when charging or discharging an equivalent capacitor of the loading node $N_{LOAD}'$ using a difference of the first current $I_1'$ and the reference current $I_{REF}$, and transmitting and amplifying the loading voltage $V_{LOAD}$ to generate an output signal Dout' corresponding to the first data $D_1'$.

The memory cell circuit 50 further comprises an unillustrated control circuit electrically connected to the first memory cell 52 and the biasing circuit 56 for providing a variety of different logic values onto the plurality of control signals when the memory cell circuit 50 is in the program mode or in the read mode. Please notice that the first data $D_1'$ is written into data of the first memory cell 52 when the memory cell circuit 50 is in the program mode.

Figure 7:
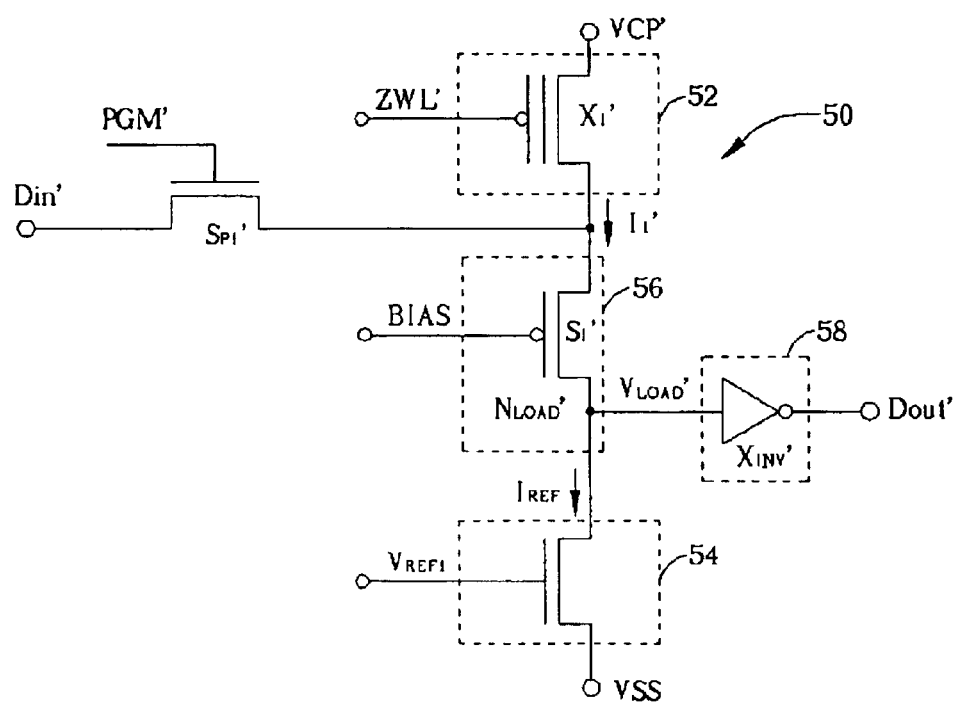
FIG. 7 is a circuit diagram of the memory cell circuit of FIG. 6.

Please refer to FIG. 6 and FIG. 7. Illustrated in FIG. 7 is a circuit diagram of the memory cell circuit 50 shown in FIG. 6. In FIG. 7, the first memory cell 52 is labeled as a memory cell $X_1'$ and is a flash memory cell having a stacked gate structure. The flash memory cell comprises a control gate, a floating gate, and two end points. The biasing circuit 56 comprises a first switch $S_1'$, the first switch $S_1$ is electrically connected between the memory cell $X_1'$ and the loading node $N_{LOAD}'$ for controlling the reception of the first current $I_1'$. The amplifying circuit 58 is an inverter $X_{INV}'$ electrically connected to the loading node $N_{LOAD}'$ for transmitting and amplifying the loading voltage $V_{LOAD}$ to generate an output signal Dout'.

The memory cell circuit 50 illustrated in FIG. 7 further comprises a data-receiving point Din' for receiving the first data Dinmeant to be stored in the memory cell $X_1'$ in the memory cell circuit 50 when the memory cell circuit 50 is in the program mode. The memory cell circuit 50 in FIG. 7 further comprises a first program switch $S_{P1'}$ wherein the first program switch $S_{P1}'$ is electrically connected between the data-receiving pointDin and the memory cell $X_1'$ for controlling the reception of the first data $D_1'$. The memory cell circuit 50 illustrated in FIG. 7 further comprises an unillustrated control circuit electrically connected to the first program switch $S_{P1}'$ for providing a mode selecting signal PGM' for controlling turning on the first program swltch$S_{P1'}$, a word line signal ZWL' electrically connected to the control gate of the memory cell $X_1'$, a first biasing voltage signal BIAS electrically connected to the first switch $S_1'$ for controlling turning on the first switch $S_1'$.

The memory cell circuit 50 in FIG. 7 further comprises an unillustrated power supplier and an unillustrated biasing voltage circuit wherein the power supplier is capable of generating a first voltage level Vpp' a second voltage level Vdd', and a ground voltage level Vss. The first voltage level Vpp' is a pumped voltage level needed when a non-volatile memory is performing programming. In FIG. 7 during programming, a voltage source VCP and VSP are level with Vpp. The second voltage level Vdd' and the ground voltage level Vss are power supplier voltages needed during data-accessing, and a potential of the first voltage level Vpp' is usually higher then second voltage level Vdd'. The biasing voltage circuit is capable of generating a first biasing voltage levelVb wherein the first biasing voltage level Vb is applied for turning on the first switch $S_1'$ to make the first switch $S_1'$ stay in an Ideal biasing voltage level for avoidinga reading disturbance from the memory cell $X_1'$. A so-called reading disturbance is a situation that a soft programming occurs because the potential difference Vds Is too large when a non-volatile memory cell is in the read mode.

In the memory cell circuit 50 illustrated in FIG. 7, the first program switch $S_{P1'}$ is an NMOS transistor, the memory cell $X_1'$is a p-type channel flash memory cell, the first switch $S_1'$ is a PMOS transistor, and the reference current unit 54 is an NMOS transistor electrically connected to a fixed reference voltage $V_{REF1}$ for generating a reference current$I_{REF}$.

Figure 8:
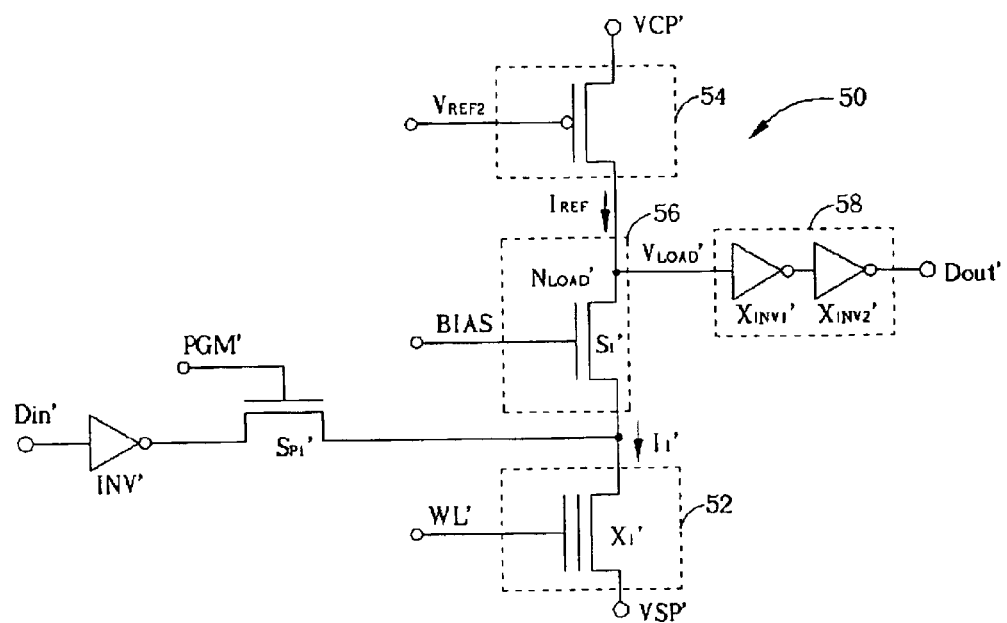
FIG. 8 is another circuit diagram of the memory cell circuit illustrated in FIG. 6.

Please refer to FIG. 6 and FIG. 8. Illustrated in FIG. 8 is another circuit diagram of the memory cell circuit 50 illustrated in FIG. 6. Because the circuit organization illustrated in FIG. 8 is very similar to the one illustrated in FIG. 7, there is no need to repeat it again. But in FIG. 8, the unillustrated control circuit of the memory cell circuit 50 provides a word line signal WL' electrically connected to the control gate of the memory cell $X_1'$, and the amplifying circuit comprises two serially connected inverters $X_{INV1}'$ and $X_{INV2'}$. Additionally, the first program switch $S_{P1'}$ is an NMOS transistor, the memory cell $X_1'$ is an n-type channel flash memory cell, the first switch $S_{1'}$ is a PMOS transistor, and thereference current unit54 is a PMOS transistor whose gate is electrically connected to a fixed voltage $V_{REF\ 2}$ for generating the reference current$I_{REF}$. Additionally, an inverter INV' is provided between the first program switch $S_{P1}'$ and the data-receiving point Din' to maintain data logic the same.

Figure 9:
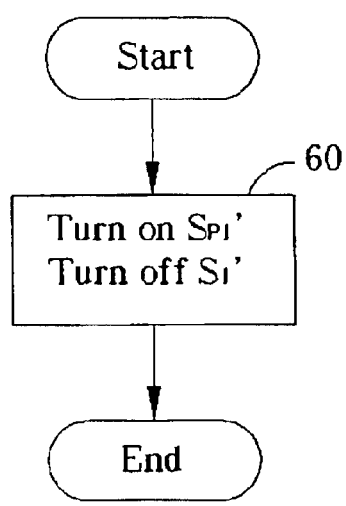
FIG. 9a is a flowchart diagram of a program process of the memory cell circuit illustrated in FIG. 7 and FIG. 8.
FIG. 9b is a flowchart diagram of a reading process of the memory cell circuit illustrated in FIG. 7 and FIG. 8.
Figure 9:
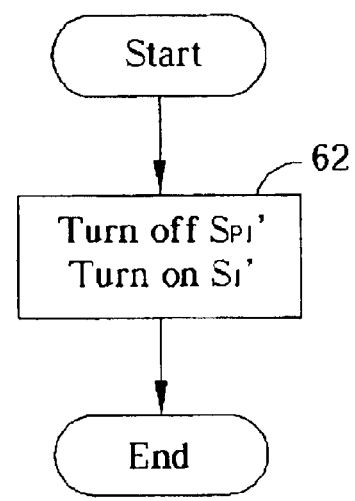

Please refer to FIG. 9a and FIG. 9b. Illustrated in FIG. 9a and FIG. 9b are flowchart diagrams of program and reading processes of the memory cell circuit 50 illustrated in FIG. 7 and FIG. 8. The program process is illustrated in FIG. 9a. It Is provided in step 60 that turning on the first program switch $S_{P1}$ and turning off the first switch $S_1'$makes the memory cell circuit 50 stay In a program mode in order to write the first data $D_1'$ to the memory cell $X_{1'}$. The reading process is illustrated in FIG. 9b. It is provided in step 62 thatturning off the first program switch $S_{P1'}$ and turning on the first switch $S_{1'}$ makes the memory cell circuit 50 stay in a read mode in order to transmit a first current $I_{1'}$ corresponding to the first data $D_{1'}$ from the memory cell $X_{1'}$ to the biasing circuit 56, to transmit the reference current $I_{REF}$ from the biasing circuit 56 to the reference current unit 54, and to charge or discharge the loading node $N_{LOAD}'$ using a difference of the first current $I_{1'}$ and the reference current $I_{REF}'$ to sense the loading voltage$V_{LOAD}''$.

Please refer to FIG. 7, FIG. 9a and FIG. 9b. The memory cell circuit 50 illustrated in FIG. 7 is applied in the program and reading processes illustrated in FIG. 9a and FIG. 9b respectively. The program process is shown in FIG. 9a. In step 60, the first biasing voltage signal BIAS gives the first voltage level VPP' to the first switch $S_{1'}$ for turning off the first switch $S_{1'}$, the word line signal ZWL' gives the ground voltage level Vss for activating the memory cell $X_1'$, the mode selecting signal PGM' gives the first voltage level Vpp' to the first program switch $S_{P1}'$ for receiving the first data $D_{1'}$ and the second data $D_{2'}$ to one end of the memory cell $X_{1'}$, and the first voltage level Vpp' is beingtransmitted to another end of the memory cell $X_1'$ (labeled as VCP' in FIG. 7) for performing data storageonthe floating gate of the memory cell $X_{1'}$.

The reading process is shown in FIG. 9b. In step 62, the first biasing voltage signal BIAS gives the first biasing voltage level Vb to the first switch $S_{1'}$ for turning on the first switch $S_{1'}$ the word line signal ZWL' gives the ground voltage level Vss for activating the memory cell $X_{1'}$, the mode selecting signal PGM' gives the ground voltage level VSS to the first program switch $S_{P1'}$ for turning off the first program switch $S_{P1'}$, and the second voltage level Vdd' and the ground voltage level Vssare being transmitted to one end of the memory cell $X_{1'}$ and the source of the reference current unit 54 respectively for generating the first current $I_1'$ and the reference current $I_{REF}$ on another end of the memory cell $X_{1'}$ and the reference current unit 54 respectively.

Please refer to FIG. 8, FIG. 9a and FIG. 9b. The memory cell circuit 50 illustrated in FIG. 8 is applied in the program and reading processes illustrated in FIG. 9a and FIG. 9b respectively. The program process is shown in FIG. 9a. In step 60, the first biasing voltage signal BIAS gives the ground voltage level Vss to the first switch $S_1$, for turning off the first switch $S_1$, the word line signal WL' gives the first voltage level Vpp' for activating the memory cell $X_1$, the mode selecting signal PGM' gives the first voltage signal Vpp' for turning on the first program switch $S_{P1}$, for receiving the first data $D_1$, to one end of the memory cell $X_1$, and the first voltage level Vppis beingtransmitted to another end of the memory cell $X_1$, (labeled as VSP in FIG. 8)for performing data storageonthe floating gate of the memory cell $X_1$'.

The reading process is shown in FIG. 9b. In step 62, the first biasing voltage signal BIAS gives the first biasing voltage level Vb to the first switch $S_1$' for turning on the first switch $S_1$, the word line signal WL' gives the second voltage level Vdd' for activating the memory cell $X_1$', the mode selecting signal PGM' gives the ground voltage level Vss to the first program switch $S_{P1}$, for turning off the first program switch $S_{P1}$, and the second voltage level Vdd' and the ground voltage level Vssare being transmitted to the source of the reference current unit 54 (labeled as VCP' In FIG. 8)and one end of the memory cell $X_1$' (labeled as VSP in FIG. 8) respectively for generating the reference current $I_{REF}$ and the first current $I_1$, on the drain of the reference current unit 54and another end of the memory cell $X_1$' respectively.

Compared to the prior art data sensing method using a sense amplifier, the present invention data sensing method applies a current generated by the memory cell to charge or discharge a loading node to sense a loading voltage on the loading node and read data stored in the memory cell. Complicated processes such as pre-charging, data sensing, and data latching are not applied in the present invention. Thus, a control circuit occupying a huge area for performing sequential control is no longer required In the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell circuit comprising:
    a first memory cell for storing a non-volatile first data to generate a first current according to the first data when the memory cell circuit is in a read mode;
    a second memory cell for storing a non-volatile second data to receive a second current according to the second data when the memory cell circuit is in the read mode;
    a biasing circuit electrically connected to the first and the second memory cell for receiving the first current from the first memory cell and transmitting the second current to the second memory cell when the memory cell circuit is in the read mode; and
    an amplifying circuit electrically connected to a loading node of the biasing circuit for sensing a loading voltage when charging or discharging the loading node using a difference of the first and the second currents, and transmitting and amplifying the loading voltage to generate an output signal corresponding to the first data.

2. The memory cell circuit of claim 1 wherein the biasing circuit comprises a first and a second switch, the first switch is electrically connected between the first memory cell and the loading node for controlling the reception of the first current, the second switch is electrically connected between the second memory cell and the loading node for controlling the transmission of the second current.

3. The memory cell circuit of claim 2 wherein the first and the second memory cells are flash memory cells having a stacked gate structure wherein each flash memory cell comprises a control gate, a floating gate, and two end points.

4. The memory cell circuit of claim 3 further comprising a data-receiving point for receiving the first data meant to be stored in the first memory cell into the memory cell circuit when the memory cell circuit is in a program mode.

5. The memory cell circuit of claim 4 further comprising an inverter and a first and a second program switch wherein the data-receiving point is electrically connected to a receiving point of the inverter, the first program switch is electrically connected between the data-receiving point and the first memory cell for controlling the reception of the first data, the second program switch is electrically connected between the output terminal of the inverter and the second memory cell for controlling the reception of the second data, wherein the first data is the complement to the second data.

6. The memory cell circuit of claim 5 further comprising a power supplier and a biasing voltage circuit wherein the power supplier is capable of generating a first voltage level, a second voltage level, and a ground voltage level, a potential of the first voltage level is higher than the second voltage level, and the biasing voltage circuit is capable of generating a first and a second biasing voltage level wherein when the first biasing voltage level is applied for turning on the first switch, the first switch is in an ideal biasing voltage level for avoiding a reading disturbance, when the second biasing voltage level is applied for turning on the second switch, the second switch is in an ideal biasing voltage level for avoiding a reading disturbance.

7. The memory cell circuit of claim 6 further comprising a control circuit for providing a mode selecting signal electrically connected to the first and the second program switches for controlling turning on and off the first and the second program switches, a word line signal electrically connected to the control gates of the first and the second memory cells, a first biasing voltage signal electrically connected to the first switch for controlling turning on the first switch, and a second biasing voltage signal electrically connected to the second switch for controlling turning on the second switch.

8. The memory cell circuit of claim 7 wherein the first and the second program switches are NMOS transistors, the first and the second memory cells are p-type channel flash memory cells, the first switch is a PMOS transistor, and the second switch is an NMOS transistor.

9. The memory cell circuit of claim 8 wherein when the memory cell circuit is in the program mode, the first biasing voltage signal gives the first voltage level to the first switch for turning off the first switch, the second biasing voltage signal gives the ground voltage level to the second switch for turning off the second switch, the word line signal gives the ground voltage level for activating the first and the second memory cells, the mode selecting signal gives the first voltage level to the first and second program switch for turning on the first and the second program switches for receiving the first and the second data to one end of the first and the second memory cells respectively, and the first voltage level is being transmitted to another end of the first and the second memory cells for performing data storage on the floating gates of the first and the second memory cells respectively.

10. The memory cell circuit of claim 8 wherein when the memory cell circuit is in the read mode, the first biasing voltage signal gives the first biasing voltage level to the first switch for turning on the first switch, the second biasing voltage signal gives the second biasing voltage level to the second switch for turning on the second switch, the word line signal gives the ground voltage level for activating the first and the second memory cells, the mode selecting signal gives the ground voltage level to the first and the second program switches for turning off the first and the second program switches, and the second voltage level and the ground voltage level are being transmitted to one end of the first and the second memory cells respectively for generating the first and the second currents on another end of the first and the second memory cells respectively.

11. The memory cell circuit of claim 7 wherein the first and the second program switches are NMOS transistors, the first and the second memory cells are N-type channel flash memory cells, the first switch is a PMOS transistor, and the second switch is an NMOS transistor.

12. The memory cell circuit of claim 11 wherein when the memory cell circuit is in the program mode, the first biasing voltage signal gives the first voltage level to the first switch for turning off the first switch, the second biasing voltage signal gives the ground voltage level to the second switch for turning off the second switch, the word line signal gives the first voltage level for activating the first and the second memory cells, the mode selecting signal gives the first voltage level to the first and second program switches for turning on the first and the second program switches for receiving the first and the second data to one end of the first and the second memory cells respectively, and the first voltage level is being transmitted to another end of the first and the second memory cells for performing data storage on floating gates of the first and the second memory cells.

13. The memory cell circuit of claim 11 wherein when the memory cell circuit is in the read mode, the first biasing voltage signal gives the first biasing voltage to the first switch for turning on the first switch, the second biasing voltage signal gives the second biasing voltage to the second switch for turning on the second switch, the word line signal gives the second voltage level for activating the first and the second memory cells, the mode selecting signal gives the ground voltage level to the first and the second program switches for turning off the first and the second program switches, and the second voltage level and the ground voltage level are being transmitted to one end of the first memory cell and the second memory cell respectively for generating the first and the second currents on another end of the first and the second memory cells respectively.

14. A memory cell circuit comprising:
a first memory cell for storing a non-volatile first data to generate a first current according to the first data when the memory cell circuit is in a read mode;
a reference current unit for generating a reference current when the memory cell circuit is in the read mode;
a biasing circuit electrically connected between the first memory cell and the reference current unit for receiving the first current from the first memory cell and transmitting the reference current to the reference current unit when the memory cell circuit is in the read mode; and
an amplifying circuit electrically connected to a loading node of the biasing circuit for sensing a loading voltage when charging or discharging the loading node using a difference of the first and the reference currents, transmitting and amplifying the loading voltage to generate anoutput signal corresponding to the first data.

15. The memory cell circuit of claim 14 wherein the biasing circuit comprises a first switch electrically connected between the first memory cell and the loading node for controlling reception of the first current.

16. The memory cell circuit of claim 15 wherein the first memory cell is a flash memory cell having a stacked gate structure; the flash memory cell comprises a control gate, a floating gate, and two end points.

17. The memory cell circuit of claim 16 further comprising a data-receiving point for receiving the first data meant to be stored in the first memory cell into the memory cell circuit when the memory cell is in a program mode.

18. The memory cell circuit of claim 17 further comprising a first program switch electrically connected between the data-receiving point and the first memory cell for controlling the transmission of the first data.

19. The memory cell circuit of claim 18 further comprising a power supplier and a biasing voltage circuit wherein the power supplier is capable of generating a first voltage level, a second voltage level, and a ground voltage level, a potential of the first voltage level is higher then the second voltage level, and the biasing voltage circuit is capable of generating a first biasing voltage level wherein when the first biasing voltage is applied for turning on the first switch, the first switch is in an ideal biasing voltage level for avoiding a reading disturbance.

20. The memory cell circuit of claim 19 further comprising a control circuit for providing a mode selecting signal electrically connected to the first program switch for controlling turning on the first program switch, a word line signal electrically connected to the control gate of the first memory cell, and a first biasing voltage signal electrically connected to the first switch for controlling turning on the first switch.

21. The memory cell circuit of claim 20 wherein the first program switch is an NMOS transistor, the first memory cell is a p-type channel flash memory cell, the first switch is a PMOS transistor, and the reference current unit is an NMOS transistor electrically connected to a fixed reference voltage for generating the reference current.

22. The memory cell circuit of claim 21 wherein when the memory cell circuit is in the program mode, the first biasing voltage signal gives the first voltage level to the first switch for turning off the first switch, the word line signal gives the ground voltage level for activating the first memory cell, the mode selecting signal gives the first voltage level to the first program switch for turning on the first program switch to transmit the first data to one end of the first memory cell, and the first voltage level is being transmitted to another end of the first memory cell for performing data storage on the first memory cell.

23. The memory cell circuit of claim 21 wherein when the memory cell circuit is in the read mode, the first biasing voltage signal gives the first biasing voltage level to the first switch for turning on the first switch, the word line signal gives the ground voltage level for activating the first memory cell, the mode selecting signal gives the ground voltage level to the first program switch for turning off the first program switch, and the second voltage level and the ground voltage level are being transmitted to one end of the first memory cell and the reference unit for generating the first current and the reference current on another end of the first memory cell and the reference unit respectively.

24. The memory cell circuit of claim 20 wherein the first program switch is an NMOS transistor, the first memory cell is an N-type channel flash memory cell, the first switch is an NMOS transistor, the reference current unit is a PMOS transistor whose gate electrically connects to a fixed reference voltage for generating the reference current.

25. The memory cell circuit of claim 24 wherein when the memory cell circuit is in the program mode, the first biasing voltage signal gives the ground voltage level to the first switch for turning off the first switch, the word line signal gives the first voltage level for activating the first memory cell, the mode selecting signal gives the first voltage level to the first program switch for turning on the first program switch so that the first data is being transmitted to one end of the first memory cell, and the first voltage level is given to another end of the first memory cell for performing data storage on the floating gate of the first memory cell.

26. The memory cell circuit of claim 24 wherein when the memory cell circuit is in the read mode, the first biasing voltage signal gives the first biasing voltage level to the first switch for turning on the first switch, the word line signal gives the second voltage level for activating the first memory cell, the mode selecting signal gives the ground voltage level to the first program switch for turning off the first program switch, and the second voltage level and the ground voltage level are being transmitted to one end of the reference unit and the first memory cell for generating the reference current and the first current on another end of the reference unit and the first memory cell.

27. A method for data writing and accessing in a memory cell circuit, the memory cell circuit comprising:
   a first memory cell for storing a non-volatile first data;
   a second memory cell for storing a non-volatile second data;
   a first program switch electrically connected to the first memory cell for controlling the reception of the first data;
   a second program switch electrically connected to the second memory cell for controlling the reception of the second data; and
   a biasing circuit comprising a first switch, a second switch, and a loading node, the first switch being electrically connected between the first memory cell and the loading node, the second switch being electrically connected between the second memory cell and the loading node;
   the method comprising:
   turning on the first and the second program switches and turning off the first and the second switches to make the memory cells stay in a program mode in order to write the first data to the first memory cell and write the second data to the second memory cell; and
   turning off the first and the second program switches and turning on the first and the second switches to make the memory cell circuit stay in a read mode in order to transmit a first current corresponding to the first data from the first memory cell to the biasing circuit, to transmit a second current corresponding to the second data from the biasing circuit to the second memory cell, and to charge or discharge a loading node using a difference of the first and the second currents so as to sense a loading voltage.

28. The method of claim 27 wherein the memory cell circuit further comprises an amplifying circuit electrically connected to the loading node of the biasing circuit, the method further comprising:
   when the memory cell is in the read mode, applying the amplifying circuit for amplifying the loading voltage for generating an output signal corresponding to the first data.

29. The method of claim 28 wherein the first and the second memory cells are flash memory cells having a stacked gate structure, each flash memory cell comprising a control gate, a floating gate, and two end points.

30. The method of claim 29 wherein the memory cell circuit further comprises a data-receiving point, the method further comprising:
   when the memory cell circuit is in the program mode, applying the datareceiving point for receiving the first data meant to be stored in the first memory cell.

31. The method of claim 30 wherein the memory cell circuit further comprises an inverter, the data-receiving point is electrically connected to a receiving point of the inverter, the first program switch electrically connected between the data-receiving point and the first memory cell for controlling the reception of the first data, the second program switch electrically connected between the output terminal of the inverter and the second memory cell for controlling the reception of the second data wherein the first data is complement to the second data.

32. The method of claim 31 wherein the memory cell circuit further comprises a power supplier and a biasing voltage circuit, the power supplier is capable of generating a first voltage level, a second voltage level, and a ground voltage level, a potential of the first voltage level is higher then the second voltage level, and the biasing voltage circuit is capable of generating a first biasing voltage and a second biasing voltage wherein when the first biasing voltage level is applied for controlling turning on the first switch, the first switch is in an ideal biasing voltage level for avoiding a reading disturbance, when the second biasing voltage level is applied for controlling turning on the second switch, the second switch is in an ideal biasing voltage level for avoiding a reading disturbance.

33. The method of claim 32 wherein the memory cell circuit further comprises a control circuit, the method further comprising:
   applying the control circuit for generating a mode selecting signal electrically connected to the first and the second program switch for controlling turning on and off the first and the second program switch.

34. The method of claim 33 wherein the first and the second program switches are NMOS transistors, the first and the second memory cells are P-type flash memory cells, the first switch is a PMOS transistor, and the second switch is an NMOS transistor.

35. The method of claim 34 wherein when the memory cell circuit is in the program mode, the method further comprises:
   giving the first voltage level to the first biasing voltage signal for turning off the first switch and giving the ground voltage level to the second biasing voltage signal for turning off the second switch; and
   giving the ground voltage level to the word line signal for activating the first and the second memory cells, giving the first voltage level to the mode selecting signal for turning on the first and the second program switches for transmitting the first and the second data to one end of the first and the second memory cells respectively, and transmitting the first voltage level to another end of the first and the second memory cells respectively for performing data storage on the floating gates of the first and the second memory cells.

36. The method of claim 34 wherein when the memory cell circuit is in the read mode, the method further comprises:
   giving the first biasing voltage level to the first biasing voltage signal for turning on the first switch, giving the second biasing voltage level to the second biasing voltage signal for turning on the second switch; and giving the ground voltage level to the word line signal for activating the first and the second memory cells, giving the ground voltage level to the mode selecting signal for turning off the first and the second program switches, and giving the second voltage level to one end of the first memory cell and giving the ground voltage level to one end of the second memory cell for generating the first and the second currents on another end of the first and the second memory cells respectively.

37. The method of claim 33 wherein the first and the second program switch are NMOS transistors, the first and the second memory cells are N-type channel flash memory cells, the first switch is a PMOS transistor, and the second switch is an NMOS transistor.

38. The method of claim 37 wherein when the memory cell circuit is in the program mode, the method further comprising:

giving the first voltage level to the first biasing voltage signal for turning off the first switch, giving the ground voltage level to the second biasing voltage signal for turning off the second switch; and giving the first voltage level to the word line signal for activating the first and the second memory cells, giving the first voltage level to the mode selecting signal for turning on the first and the second program switches so as to transmit the first and the second data to one end of the first and the second memory cells, and transmitting the first voltage level to another end of the first and the second memory cells for performing data storage on the floating gates of the first and the second memory cells.

39. The method of claim 37 wherein when the memory cell circuit is in the read mode, the method further comprising:

giving the first biasing voltage to the first biasing voltage signal for turning on the first switch, giving the second biasing voltage level to the second biasing voltage signal for turning on the second switch; and giving the second voltage level to the word line signal for activating the first and the second memory cells, giving the ground voltage level to the mode selecting signal for turning off the first and the second program switches, and giving the second voltage level to one end of the first memory cell and giving the ground voltage level to one end of the second memory cell for generating the first and the second currents on another end of the first and the second memory cells respectively.

40. A method for data writing and accessing in a memory cell circuit, the memory cell circuit comprising:

a first memory cell for storing a non-volatile first data;

a reference current unit for providing a reference current;

a first program switch electrically connected to the first memory cell for controlling the reception of the first data; and a biasing circuit comprising a first switch and a loading node, the first switch being electrically connected between the first memory cell and the loading node, the loading mode being electrically connected to the reference current unit;

the method comprising:

turning on the first program switch and turning off the first switch to make the memory cell circuit stay in a program mode in order to write the first data into the first memory cell; and turning off the first program switch and turning on the first switch to make the memory cell circuit stay in a read mode In order to transmit a first current corresponding to the first data from the first memory cell to the biasing circuit, transmit a reference current from the biasing circuit to the reference current unit, and to charge or discharge the loading node using a difference of the first and the reference currents so as to sense a loading voltage.

41. The method of claim 40 wherein the memory cell circuit further comprises an amplifying circuit electrically connected to the loading node of the biasing circuit, the method further comprising:

when the memory cell is in the read mode, applying the amplifying circuit for amplifying the loading voltage for generating an output signal corresponding to the first data.

42. The method of claim 41 wherein the first memory cell is a flash memory cell having a stacked gate structure, the flash memory cell comprising a control gate, a floating gate, and two end points.

43. The method of claim 41 wherein the memory cell circuit further comprises a end for receiving data, the method further comprising:

when the memory cell circuit is in the program mode, applying the datareceiving point for receiving the first data meant to be stored in the first memory cell.

44. The method of claim 43 wherein the memory cell circuit further comprises a first program switch electrically connected between the data-receiving point and the first memory cell for controlling receiving the first data.

45. The method of claim 44 wherein the memory cell further comprises a power supplier and a biasing voltage circuit, the power supplier is capable of generating a first voltage level, a second voltage level, and a ground voltage level, a potential of the first voltage level is higher then the second voltage level, and the biasing voltage circuit is capable of generating a first biasing voltage level wherein when the first biasing voltage is applied for turning on the first switch, the first switch is in an ideal biasing voltage level for avoiding a reading disturbance.

46. The method of claim 45 wherein the memory cell circuit further comprises a control circuit, the method further comprising:

applying the control circuit for generating a mode selecting signal electrically connected to the first program switch for controlling the turning on and off the first program switch;

a word line signal electrically connected to the control gate of the first memory cell; and a first biasing voltage signal electrically connected to the first switch for controlling the turning on and off the first switch.

47. The method of claim 46 wherein the first program switch is an NOMS transistor, the first memory cell is a P-type channel flash memory cell, the first switch is a PMOS transistor, and the reference current unit is an NMOS transistor whose gate electrically connects to a fixed reference voltage for generating the reference current.

48. The method of claim 47 wherein when the memory cell is in the program mode, the method further comprises:

giving the first voltage level to the first biasing voltage signal for turning off the first switch; and giving the ground voltage level to the word line signal for activating the first memory cell, giving the first voltage level to the mode selecting signal for turning on the first program switch to transmit the first data to one end of the first memory cell, and transmitting the first voltage level to another end of the first memory cell for performing data storage on the floating gate of the first memory cell.

49. The method of claim 47 wherein when the memory cell is in the read mode, the method further comprises:

giving the first biasing voltage level to the first biasing voltage signal for turning on the first switch; and giving the ground voltage level to the word line signal for activating the first memory cell, giving the ground voltage level to the mode selecting signal for turning off the first program switch, and giving the second voltage level and the ground voltage level to one end of the first memory cell and the reference unit for generating the first current and the reference current on another end of the first memory cell and the reference unit respectively.

50. The method of claim 46 wherein the first program switch is a NMOS transistor, the first memory cell is a N-type channel flash memory cell, the first switch is a NMOS transistor, and the reference current unit is a PMOS transistor whose gate electrically connected to a fixed reference voltage for generating the reference current.

51. The method of claim 50 wherein when the memory cell circuit is in the program mode, the method further comprises:

giving the ground voltage level to the first biasing voltage signal for turning off the first switch; and giving the first voltage level to the word line signal for activating the first memory cell, giving the first voltage level to the mode selecting signal for turning on the first program switch to transmit the first data to one end of the first memory cell for performing data storage on the floating gate of the first memory cell.

52. The method of claim 50 wherein when the memory cell circuit is in the read mode, the method further comprises:

giving the first biasing voltage to the first biasing voltage signal for turning on the first switch; and giving the second voltage level to the word line signal for activating the first memory cell, giving the ground voltage level to the mode selecting signal for turning off the first program switch, and giving the ground voltage level and the second voltage level to one end of the first memory cell and the reference unit for generating the first current and the reference current on another end of the first memory cell and the reference unit respectively.

* * * * *